(12) United States Patent
Kidnie

(10) Patent No.: US 8,945,813 B2
(45) Date of Patent: Feb. 3, 2015

(54) MASK FORMING IMAGEABLE MATERIAL AND USE

(71) Applicant: Kevin M. Kidnie, St. Paul, MN (US)

(72) Inventor: Kevin M. Kidnie, St. Paul, MN (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 13/865,414

(22) Filed: Apr. 18, 2013

(65) Prior Publication Data

US 2014/0315129 A1    Oct. 23, 2014

(51) Int. Cl.

| | | |
|---|---|---|
| *G03F 7/00* | (2006.01) | |
| *B41C 1/00* | (2006.01) | |
| *G03F 7/004* | (2006.01) | |
| *B41M 5/00* | (2006.01) | |
| *G03F 7/11* | (2006.01) | |
| *G03F 7/20* | (2006.01) | |
| *G03F 7/24* | (2006.01) | |
| *G03F 7/38* | (2006.01) | |
| *G03F 7/32* | (2006.01) | |
| *G03F 7/34* | (2006.01) | |

(52) U.S. Cl.
CPC . *B41C 1/00* (2013.01); *G03F 7/004* (2013.01); *B41M 5/00* (2013.01); *G03F 7/11* (2013.01); *G03F 7/2014* (2013.01); *G03F 7/2016* (2013.01); *G03F 7/202* (2013.01); *G03F 7/24* (2013.01); *G03F 7/38* (2013.01); *G03F 7/325* (2013.01); *G03F 7/343* (2013.01)
USPC ............... 430/270.1; 430/271.1; 430/273.1

(58) Field of Classification Search
CPC ........ B41M 5/465; G03F 1/68; G03F 7/2014; B41C 1/05; B41C 1/1016; B41C 2201/02; B41C 2201/04

USPC ................. 430/270.1, 271.1, 273.1
See application file for complete search history.

(56) References Cited

U.S. PATENT DOCUMENTS

| | | | |
|---|---|---|---|
| 5,171,650 | A | 12/1992 | Ellis et al. |
| 5,496,685 | A | 3/1996 | Farber et al. |
| 6,259,465 | B1 | 7/2001 | Tutt et al. |
| 6,864,039 | B2 | 3/2005 | Cheng et al. |
| 7,226,709 | B1 | 6/2007 | Kidnie et al. |
| 7,279,254 | B2 | 10/2007 | Zwadlo |
| 7,799,504 | B2 | 9/2010 | Zwadlo et al. |
| 2005/0227182 | A1 | 10/2005 | Ali et al. |
| 2011/0183260 | A1 | 7/2011 | Fohrenkamm et al. |

FOREIGN PATENT DOCUMENTS

| | | | |
|---|---|---|---|
| EP | 1 129 859 | A1 | 9/2001 |
| EP | 1 184 196 | A2 | 3/2002 |

*Primary Examiner* — Chanceity Robinson
(74) *Attorney, Agent, or Firm* — J. Lanny Tucker

(57) ABSTRACT

An imageable material can be used to form a mask image for providing a relief image. This imageable material has a simplified structure and consists essentially of, in order: a transparent polymeric carrier sheet and a barrier layer comprising a first infrared radiation absorbing compound. A first ultraviolet radiation absorbing compound is provided in the transparent polymeric carrier sheet or the barrier layer. A non-silver halide thermally sensitive imageable layer is disposed on the barrier layer and comprises a second infrared radiation absorbing compound and a second ultraviolet radiation absorbing compound. A relief image is formed by imaging the imageable material to form an imaged mask material, exposing a relief-forming material with curing radiation through the imaged mask material to form exposed regions and non-exposed regions, and developing the imaged relief-forming material to form a relief image by removing its non-exposed regions.

8 Claims, No Drawings

MASK FORMING IMAGEABLE MATERIAL AND USE

FIELD OF THE INVENTION

This invention relates to an imageable material that can be thermally imaged to provide an imaged mask material, which in turn can be used to provide a relief image such as in a flexographic printing plate. This invention also provides a method for forming a relief image using the imaged mask material.

BACKGROUND OF THE INVENTION

Radiation-sensitive relief-forming materials having a suitable relief-forming material or layer are known in the art. An important advance in the art of making and using masking films to provide relief images in such materials is described in U.S. Patent Application Publication 2005/0227182 (Ali et al., hereinafter cited as U.S. '182). For example, this publication describes useful materials and methods for providing flexographic printing plates having a suitable relief image, using a thermally sensitive mask forming imageable material.

Thus, a relief image can be produced creating a mask, for example by thermal imaging a suitable masking film or element to provide the desired pattern (generally using an infrared radiation laser under computer control) through which a photocurable element is imaged, typically using ultraviolet radiation. For example, U.S. '182 describes means for forming an imaged mask material.

For example, the imaged mask material is placed in contact with a relief-forming material and subjected to overall exposure with actinic radiation (for example, UV radiation) to cure the relief-forming material in the unmasked areas and thus form a negative image of the imaged mask material in the relief-forming material. The imaged mask material can then be removed and the uncured regions on the relief-forming material are removed using a development process. After drying, the resulting imaged relief-forming material has a relief image that can be used for suitable printing operations.

Advances in imageable materials are described in U.S. Pat. No. 7,799,504 (Zwadlo et al.) for making imaged mask materials. These imageable materials have at least 5 layers coated onto a transparent substrate.

In materials having a relief image, such as flexographic printing plates, the combination of highlight dot retention and reverse line depths (RLD) define exposure latitude of an imaging system. Highlight dot retention is important for adequate fine resolution printing and adequate reverse line depths are important to provide clean line images with good separation in the resulting printed impressions (no halation). Typically, with increased exposure of the relief-forming material through the imageable material (mask), highlight retention is increased while reverse line depths are decreased.

There is a desire to use a considerably simpler design for such imageable materials used to form masks that can be used to provide excellent reverse line depths without compromising highlight dot retention.

SUMMARY OF THE INVENTION

To address this need in the art, the present invention provides an imageable material consisting essentially of, in order:

(a) a transparent polymeric carrier sheet, (b) a barrier layer disposed directly on the transparent polymeric carrier sheet, the barrier layer comprising a first infrared radiation absorbing compound, wherein either or both of the transparent polymeric carrier sheet and barrier layer further comprise a first ultraviolet radiation absorbing compound, and (c) a non-silver halide thermally sensitive imageable layer disposed directly on the barrier layer, the non-silver halide thermally sensitive imageable layer comprising a second infrared radiation absorbing compound and a second ultraviolet radiation absorbing compound, both dispersed within a polymeric binder.

In addition, the present invention also provides a method of making a relief image, the method comprising:

imaging the imageable material of any of the embodiments of the present invention to form an imaged mask material, exposing a relief-forming material with curing radiation through the imaged mask material while they are in complete optical contact, to form an imaged relief-forming material with exposed regions and non-exposed regions, and developing the imaged relief-forming material to form a relief image by removing its non-exposed regions.

In many embodiments of this invention, the method of this invention is carried out using an imageable material of the present invention that is defined with the following features:

(a) the first ultraviolet radiation absorbing compound is present only in the barrier layer, the first and second ultraviolet radiation absorbing compounds in the imageable material are the same or different UV-absorbing dyes, and the amount of the first ultraviolet radiation absorbing compound is less than the amount of the second ultraviolet radiation absorbing compound, (b) the barrier layer in the imageable material comprises a heat-combustible polymer binder that is nitrocellulose, a poly(cyanoacrylate), or a combination thereof, and optionally metal oxide particles or crosslinking agents, or the barrier layer is a metal or metalized layer, (c) the non-silver halide thermally sensitive imageable layer in the imageable material comprises a polymer or resin binder that is a polyurethane, poly(vinyl butyral), (meth)acrylamide polymer, nitrocellulose, polyacetal, polymer derived at least in part from any of methyl methacrylate, ethyl methacrylate, n-butyl methacrylate, and isobutyl methacrylate, or a combination of two or more of these materials, (d) the transparent polymeric carrier sheet comprises a polyester, polyethylene-polypropylene copolymer, polybutadiene, polycarbonate, polyacrylate, vinyl chloride polymer, hydrolyzed or non-hydrolyzed cellulose acetate, or a combination of two or more of these materials, and optionally comprising an adhesion promoter, (e) the imageable material comprising one or more of the following conditions:

(i) the transparent polymeric carrier sheet has an average dry thickness of at least 25 µm and up to and including 250 µm, (ii) the barrier layer has an average dry thickness of at least 0.25 µm and up to and including 2.5 µm, and (iii) the non-silver halide thermally sensitive imageable layer has an average dry thickness of at least 0.5 µm and up to and including 5 µm, and when the imageable material further comprises a transparent polymeric overcoat layer attached directly to the non-silver halide thermally sensitive imageable layer, and the transparent polymeric overcoat layer has an average dry thickness of at least 0.05 µm and up to and including 1 µm, and (f) the non-silver halide thermally sensitive imageable layer of the imageable material comprises the polymer or resin binder in an amount of at least 25 weight % and up to and including 75 weight %.

This invention can also provide a relief-forming assemblage, comprising:

an imaged mask material prepared from the imageable material of this invention, which imaged mask material has a mask layer formed from the non-silver halide thermally sensitive imageable layer, and a suitable relief-forming material as described herein, wherein the imaged mask material is arranged in optical contact with the relief-forming material so that the mask layer is directly adjacent the relief-forming material.

The imageable material of the present invention represents another advance in the art. While it has only three essential layers, compared to more complicated known imageable materials, it provides the same performance as those more complicated imageable materials. Thus, the imaging system including the inventive imageable material and its use with relief-forming materials provides excellent reverse line depths (RLD's) without compromising the highlight dot retention.

Further advantages of the present invention will become apparent from the following detailed description of the invention.

DETAILED DESCRIPTION OF THE INVENTION

Definitions

As used herein to define various components of the layers, formulations, compositions, developers, or solutions, unless otherwise indicated, the singular forms "a," "an," and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term definition should be taken from a standard dictionary.

The use of numerical values in the various ranges specified herein, unless otherwise expressly indicated otherwise, are considered to be approximations as though the minimum and maximum values within the stated ranges were both preceded by the word "about". In this manner, slight variations above and below the stated ranges can be used to achieve substantially the same results as the values within the ranges. In addition, the disclosure of these ranges is intended as a continuous range including every value between the minimum and maximum values.

Unless indicated herein, the "imageable material" described herein is an embodiment of the present invention. Such an imageable material can also be known as a "mask element," "mask film," or "masking element." After being imaged, the imaged mask material can also be known as a "mask," "imaged film," or "imaged masking film" and contains the mask image used to form a relief image.

Unless otherwise indicated, percentages are by weight.

The term "relief-forming material" used herein refers to any imageable element or material in which a relief image can be produced by exposure through the imaged mask material. Examples of such relief-forming materials are described in detail below but some relief-forming materials include flexographic printing plate precursors and printed circuit boards. Details of useful relief-forming materials are described in U.S. Patent Application Publication 2005/0227182 (noted above), the disclosure of which is incorporated herein by reference. In this publication, the relief-forming materials are generally identified as "radiation-sensitive elements".

Unless otherwise indicated, the term "ablative" refers to thermal imaging by means of a laser that causes rapid local changes in an imageable layer of the imageable material thereby causing the material(s) in the imageable layer to be ejected from the imageable layer. This is distinguishable from other material transfer or imaging techniques (such as melting, evaporation, or sublimation).

The term "optical contact" means that two layers or two elements (as in the case of the imaged mask material and a relief-forming material) are in intimate contact so that there is essentially no air-gap or void between the contacted surfaces, thus providing an "air-free interface". More precisely, two surfaces are defined as being in optical contact when the reflection and transmission characteristics of their interface are essentially fully described by the Fresnel laws for the reflection and transmission of light at the refractive-index boundary.

The term "transparent" refers to the ability to transmit at least 95% of impacting light.

Imageable Materials

The imageable material of this invention is simpler in construction than those known in the art, including those described in U.S. Pat. No. 7,799,504 (noted above). Specifically, the imageable material has only three essential layers or films as described below, that is, the transparent polymeric carrier sheet, the barrier layer, and the non-silver halide thermally sensitive imageable layer. Only these three layers or films are essential for forming a mask image. However, as noted below, in some embodiments, a transparent polymeric overcoat can be attached directly to the non-silver halide thermally sensitive imageable layer, but this optional feature is not required for forming a mask image. Rather, it can be helpful for providing abrasion resistance as described below.

The imageable material is used to form a mask image that is used eventually to form a relief image. The imageable material has a non-silver halide thermally sensitive imageable layer and a barrier layer disposed on a transparent polymeric carrier sheet.

Transparent Polymeric Carrier Sheet:

The transparent polymeric carrier sheet can be any suitable transparent substrate or film. Useful transparent polymeric carrier sheets can be but are not limited to, transparent polymeric films and sheets such as polyesters including poly(ethylene terephthalate), poly(ethylene naphthalate), and fluorine polyester polymers, polyethylene-polypropylene copolymers, polybutadienes, polycarbonates, polyacrylates (polymers formed at least in part from one or more acrylate ethylenically unsaturated monomers), polyvinyl chloride and copolymers thereof, and hydrolyzed and non-hydrolyzed cellulose acetate, or a combination of two or more of these materials, as a single film or laminate of multiple films. Generally, the transparent polymeric carrier sheet has an average dry thickness of at least 25 μm and up to and including 250 μm, or typically at least 75 μm and up to and including 175 μm. The average dry thickness is determined similar to that for the non-silver halide thermally sensitive imageable layer.

For example, a transparent poly(ethylene terephthalate) sheet sold under the name of MELINEX by DuPont Teijin Films (Hopewell, Va.) is suitable as a transparent polymeric carrier sheet.

If necessary, the transparent polymeric carrier sheet surface can be treated to modify its wettability and adhesion to applied coatings. Such surface treatments include but are not limited to corona discharge treatment and the application of subbing layers.

If desired, the transparent polymeric carrier sheet can also comprise one or more "first" ultraviolet radiation absorbing compounds (as described below for the barrier layer). The one or more compounds can be the same or different as the first ultraviolet radiation absorbing compound in the barrier layer, and they can be the same or different compounds as the "second" ultraviolet radiation absorbing compounds as described below. Each of these ultraviolet radiation absorbing compounds generally absorbs radiation of at least 150 nm and up to and including 450 nm. These compounds can be present in the transparent polymeric carrier sheet in an amount of at least 0.01 weight % and up to and including 0.1 weight %, based on the total dry transparent polymeric carrier sheet weight.

In addition, the transparent polymeric carrier sheet can contain one or more "adhesion promoters" that improve adhesion between it and the adjacent barrier layer. Useful adhesion promoters include but are not limited to, gelatin, poly(vinylidene chloride), poly(acrylonitrile-co-vinylidene chloride-co-acrylic acid), and polyethylenimine.

Barrier Layer:

The imageable material of this invention also comprises a barrier layer disposed directly between the transparent polymeric carried sheet and the non-silver halide thermally sensitive imageable layer. Suitable barrier compositions are also described in U.S. '182 (noted above) and references cited therein. For example, the barrier layer can comprise one or more polymer binders, particularly, "heat-combustible" polymer binders such as poly(alkyl cyanoacrylate)s and nitrocellulose, or a combination thereof, or particulate materials such as metal oxide particles (for example, iron oxide particles) to provide high optical density with respect to relief-image forming curing radiation. Metal oxide particles can be useful for ablative imaging because they can thermally decompose to generate propulsive gases. When the barrier layer comprises one or more polymer binders, those materials are present in an amount of at least 50 weight % and up to and including 99 weight %, based on total dry barrier layer weight.

The barrier layer can alternatively be composed of a metal or metalized layer in place or part or all of the polymer binders.

The barrier layer further comprises one or more infrared absorbing compounds that are collectively identified herein as the "first" infrared radiation absorbing compound to distinguish it, if necessary, from the second infrared radiation absorbing compound in the non-silver halide thermally sensitive imageable layer. The first infrared radiation absorbing compound can be one or more dyes or pigments, or mixtures thereof that will provide desired spectral absorption properties and is sensitive to radiation in the range of at least 700 nm and up to and including 1500 nm and typically at least 750 nm and up to and including 1200 nm. It can be a particulate material that is dispersed within the polymeric binder(s) described below. For example, they can be black dyes or pigments such as carbon black, metal oxides, and other materials described for example in U.S. '182 (noted above).

One suitable IR-absorbing pigment is carbon black of which there are numerous types with various particles sizes that are commercially available. Examples include RAVEN 450, 760 ULTRA, 890, 1020, 1250 and others that are available from Columbian Chemicals Co. (Atlanta, Ga.) as well as BLACK PEARLS 170, BLACK PEARLS 480, VULCAN XC72, BLACK PEARLS 1100 and others available from Cabot Corp. (Walthan, Mass.). Other useful carbon blacks are surface-functionalized with solubilizing groups. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful.

Useful first infrared radiation absorbing compounds include IR dyes including but not limited to, cationic infrared-absorbing dyes and photothermal-bleachable dyes, and crosslinking agents such as melamine-formaldehyde resins, dialdehydes, phenolics, polyfunctional aziridines, isocyanates, and urea-formaldehyde epoxies to provide greater thermal resistance.

Examples of suitable IR dyes include but are not limited to, azo dyes, squarilium dyes, croconate dyes, triarylamine dyes, thiazolium dyes, indolium dyes, oxonol dyes, oxazolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135 (Patel et al.), U.S. Pat. No. 6,569,603 (Furukawa), and U.S. Pat. No. 6,787,281 (Tao et al.), and EP Publication 1,182,033 (Fijimaki et al.). A general description of one class of suitable cyanine dyes is shown by the formula in paragraph [0026] of WO 2004/101280, incorporated herein by reference.

In addition to low molecular weight IR-absorbing dyes, IR dye moieties bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), U.S. Pat. No. 5,496,903 (Watanate et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (DeBoer).

The infrared radiation absorbing compound is generally present in an amount to provide a transmission optical density of at least 0.025 and typically of at least 0.05 at the exposing wavelength. Generally, this is achieved by including at least 0.2 weight % and up to and including 2 weight %, or typically at least 0.3 weight % and up to and including 1 weight % of the one or more infrared radiation absorbing compounds, based on the total dry weight of the barrier layer.

The first infrared radiation absorbing compound in the barrier layer can be the same or different chemical compound(s) as the second infrared radiation absorbing compound that is incorporated into the non-silver halide thermally sensitive imageable layer that is described below. In most embodiments, the first and second infrared radiation absorbing compounds are the same chemical materials. The amounts of the first and second infrared radiation absorbing compounds in the imageable material can be the same or different. In most embodiments, they are present in different amounts in the imageable material.

In addition, in addition to or alternatively to the transparent polymeric carrier sheet, the barrier layer can comprise one or more ultraviolet radiation absorbing compounds that are collectively identified herein as the "first" ultraviolet radiation absorbing compound to distinguish it, if necessary, from the second ultraviolet radiation absorbing compound in the non-silver halide thermally sensitive imageable layer. These compounds generally absorb radiation of at least 150 nm and up to and including 450 nm. In most embodiments, the first ultraviolet radiation absorbing compounds are provided only in the barrier layer.

In general, useful ultraviolet radiation absorbing compounds include but are not limited to benzotriazoles, halogenated benzotriazoles, triazines, benzophenones, benzoates, salicylates, substituted acrylonitriles, cyanoacrylates, benzilidene malonates, oxalanilides, and mixtures thereof.

Examples of useful ultraviolet radiation absorbing compounds include but are not limited to, UV absorbing dyes or UV stabilizers marketed under the names Uvinul® (BASF), Keyplast® (Keystone Aniline Corporation), Sanduvor® (Sandoz Chemicals Corp.), Hostavin (Clariant), and Tinuvin® (BASF or Ciba). Examples of useful compounds are described in U.S. Pat. No. 5,496,685 (Farber et al.).

The one or more first ultraviolet radiation absorbing compounds are generally present in the barrier layer in an amount of at least 0.1 weight % and up to and including 10 weight %, or typically at least 0.5 weight % and up to and including 5 weight %, based on the total dry barrier layer weight.

The first ultraviolet radiation absorbing compound in the barrier layer (or transparent polymeric carrier sheet) can be the same or different chemical compound(s) as the second ultraviolet radiation absorbing compound that is incorporated into the non-silver halide thermally sensitive imageable layer described below. In most embodiments, the first and second ultraviolet radiation absorbing compounds are the same chemical materials. The amounts of the first and second ultraviolet radiation absorbing compounds in the imageable material are different. In most embodiments, the amount of the first ultraviolet radiation absorbing compound is less than the amount of the second ultraviolet radiation absorbing compound. For example, the amount of the first ultraviolet radiation absorbing compound can be at least 2% and up to and including 20% of the amount of the second ultraviolet radiation absorbing compound.

Optionally, the barrier layer can comprise a crosslinking agent for improved handling.

The barrier layer generally has an average dry thickness of at least 0.25 µm and up to and including 2.5 µm or typically at least 0.5 µm and up to and including 1.5 µm. The average dry thickness is measured in a manner similar to that for the non-silver halide thermally sensitive layer described below.

Non-Silver Halide Thermally Sensitive Imageable Layer:

The non-silver halide thermally sensitive imageable layer is generally disposed directly on the barrier layer as relatively uniform coatings (that is, being substantially continuous and having fairly uniform thickness). In most embodiments, the non-silver halide thermally sensitive imageable layer is a single coated or applied layer, but in other embodiments, there are multiple layers or coatings making up the non-silver halide thermally sensitive imageable layer disposed directly on the barrier layer described above.

There is essentially no silver halide present in this layer. In other words, no silver halide is purposely added or created in the non-silver halide thermally sensitive imageable layer.

The non-silver halide thermally sensitive imageable layer generally includes one or more second ultraviolet radiation absorbing compounds that can be the same or different compounds as the first ultraviolet radiation absorbing compounds. The amount of such compounds in this layer can be at least 10 weight % and up to and including 50 weight %, or typically at least 20 weight % and up to and including 40 weight %, based on the total dry weight of the non-silver halide thermally sensitive imageable layer. Examples of useful second ultraviolet radiation absorbing compounds are described above.

The non-silver halide thermally sensitive imageable layer(s) also comprises one or more second infrared radiation absorbing compounds that can be the same or different as the first infrared radiation absorbing compound described above. Those compounds are incorporated herein as useful components of the non-silver halide thermally sensitive imageable layer.

The second infrared radiation absorbing compound is generally present in the non-silver halide thermally sensitive imageable layer in an amount to provide a transmission optical density of at least 0.5 and typically of at least 0.75 at the exposing wavelength. Generally, this is achieved by including at least 5 weight % and up to and including 25 weight % of the one or more second infrared radiation sensitive compounds, based on the total dry weight of the non-silver halide thermally sensitive imageable layer.

The non-silver halide thermally sensitive imageable layer can optionally include a fluorocarbon additive for enhancing transfer of a molten or softened film and production of halftone dots (that is, pixels) having well-defined, generally continuous, and relatively sharp edges. Examples of useful fluorocarbon additives and amounts are provided in [0087] to [0089] of U.S. '182 (noted above).

Additional optional components of the non-silver halide thermally sensitive imageable layer include but are not limited to, plasticizers, coating aids or surfactants, dispersing aids, and fillers, all of which are well known in the art as described for example in [0094] to [0096] of U.S. '182 (noted above).

All of the components described above for the non-silver halide thermally sensitive imageable layer are dispersed in one or more polymers or resins as binders (both synthetic and naturally occurring polymeric materials) that are capable of dissolving or dispersing the components in a uniform manner throughout the non-silver halide thermally sensitive imageable layer. The one or more polymer or resin binders are generally present in an amount of at least 25 weight % and up to and including 75 weight %, and typically of at least 35 weight % and up to and including 65 weight %, based on the total dry weight of the non-silver halide thermally sensitive imageable layer.

Useful polymer or resin binders include but are not limited to, the materials described for example in [0081] to [0085] of U.S. '182. The polymer or resin binders can also be known as "adhesive binders" as described for example in [0081] of U.S. '182. Examples of such adhesive binders include but are not limited to, acetyl polymers such as poly(vinyl butyral)s that can be obtained for example as BUTVAR® B-76 from Solution, Inc. (St. Louis, Mo.) and acrylamide polymers that can be obtained as MACROMELT 6900 from Henkel Corp. (Gulph Mills, Pa.). Pressure-sensitive adhesive polymers can also be used for this purpose.

In some embodiments, it is advantageous to use polymer or resin binders that are easily thermally combustible, and that generates gases and volatile fragments at temperature less than 200° C. Examples of these materials are nitrocellulose, polycarbonates, polyurethanes, polyesters, polyorthoesters, polyacetals, and copolymers thereof (see for example, U.S. Pat. No. 5,171,650 of Ellis et al., Col. 9, lines 41-50, the disclosure of which is incorporated herein by reference).

Other useful polymer or resin binders include resins having hydroxyl groups (or hydroxylic polymers) as described in [0082] to [0084] of U.S. '182 (noted above) such as poly (vinyl alcohol)s and cellulosic polymers (such as nitrocellulose). Still other useful polymers are non-crosslinkable polyesters, polyamides, polycarbamates, polyolefins, polystyrenes, polyethers, polyvinyl ethers, polyvinyl esters, and polyacrylates and polymethacrylates having alkyl groups with 1 and 2 carbon atoms.

Some other useful polymeric binders that have been found to be readily dissolved or dispersed in non-chlorinated organic solvents are described below. They can also be dissolvable or dispersible in chlorinated organic solvents. Such useful classes of polymers that meet these characteristics include but are not limited to, terpene resins, phenolic resins, aromatic hydrocarbon resins, polyurethanes (including polyether polyurethanes), long-chain acrylate and methacrylate resins. Useful terpene resins include but are not limited to the SYLVARES terpene resins such as SYLVARES TR-A25 terpene resin that is available from Arizona Chemical Co. (Jacksonville, Fla.). Useful phenolic resins include but are not limited to, novolac resins such as CK2500 and CK2400 novolac resins that are available from Georgia Pacific Resins (Atlanta, Ga.). Aromatic hydrocarbon resins include but are not limited to, NORSOLENE® resins such as NORSOLENE® S-155 resin that are available from Sartomer Co. (Warrington, Pa.). Useful polyurethanes include but are not limited to, SURKOPAK® 5245 and SURKOFILM® 72S polyurethane resins that are available from Tennants Inks & Coatings Supplies, Ltd. (Surrey, UK) and NeoRez 322 polyurethane resin that is available from DSM NeoResins (Wilmington, Mass.). Long chain acrylate and methacrylate resins include those vinyl polymers derived from one or more long chain acrylate or methacrylate monomers wherein the long alkyl chain has at least 3 carbon atoms. Such monomers include but are not limited to, iso-butyl methacrylate, n-butyl methacrylate, and mixtures thereof.

Other useful polymers are homopolymers and copolymers derived from at least iso-butyl methacrylate, n-butyl methacrylate, or mixtures thereof. Commercially available primary polymeric materials of this type include ELVACITE® 2045 and ELVACITE® 2046 polymers that are available from Lucite International (Cordova, Tenn.). For example, it was found that the commercial polymers available as SURKOPAK® 5245 polyurethane resin and SURKOFILM® 72S polyurethane resin, ELVACITE® 2045 polymeric material, and CK 2500 novolac resin are useful.

Particularly useful polymer or resin binders include but are not limited to, a polyurethane, poly(vinyl butyral), (meth) acrylamide polymer, nitrocellulose, polyacetal, polymer derived at least in part from any of methyl methacrylate, ethyl methacrylate, n-butyl methacrylate, and isobutyl methacrylate, or a combination of two or more of these materials.

The non-silver halide thermally sensitive imageable layer can further include plasticizers, coating aids, dispersing agents, fillers, surfactants, fluorocarbons, adhesion promoters, and other additives as described in U.S. '182 (noted above).

The non-silver halide thermally sensitive imageable layer can have an average dry thickness of at least 0.5 µm and up to and including 5 µm or typically of at least 0.8 µm and up to and including 2.5 µm. The average dry layer thickness is generally an average of 10 different measurements of a dry cross-sectional image of the layer.

Transparent Polymeric Overcoat Layer:

In some embodiments, the imageable material comprises a transparent polymeric overcoat layer, although it is not essential to the advantages of the present invention. The transparent polymeric overcoat layer generally includes one or more transparent film-forming polymers or resins including but not limited to, a methacrylic acid copolymer (such as a copolymer of ethyl methacrylate and methacrylic acid) and particles of one or more fluoropolymers dispersed therein as described, for example, in U.S. Pat. No. 6,259,465 (Tutt et al.) the disclosure of which is incorporated herein by reference. The transparent polymeric overcoat layer can provide abrasion resistance to handling due to the presence of the particulates. It can also act as a barrier to prevent chemical migration from the imaged mask material to the relief-forming material when they are in intimate contact.

When present, the transparent polymeric overcoat layer can be attached directly to the non-silver halide thermally sensitive imageable layer and has an average dry thickness of at least 0.05 µm and up to and including 1 µm. Average dry thickness is measured similar to that for the non-silver halide thermally sensitive imageable layer.

Relief-Forming Materials

Considerable details of useful relief-forming materials such as flexographic printing plate precursors and printed circuit boards are provided in U.S. '182 (noted above). Such relief-forming materials generally include a suitable dimensionally stable substrate, at least one radiation-sensitive layer, and optionally a separation layer, cover sheet, or metal layer. Suitable substrates include dimensionally stable polymeric films and aluminum sheets. Polyester films are particularly useful. Any radiation-sensitive element that is capable of producing a relief image using the imageable material described above is useful in the practice of this invention.

The relief-forming material can be positive- or negative-working, but typically, it is negative-working and generally includes a radiation-sensitive imageable layer (or photocurable or relief-image forming layer) containing a visible-radiation or UV-radiation curable composition that is cured or hardened by polymerization or crosslinking upon exposure to the curing radiation. For example, the relief-forming material can be UV-sensitive. Many details of various components of the radiation-sensitive elements are provided in U.S. '182 (noted above) and references cited therein.

Some embodiments of relief-forming materials also include a removable cover sheet as well as a separation layer, or sometimes referred to as anti-tack layer, that helps removal of the cover sheet and protects the radiation-sensitive imageable layer from fingerprints and other damage and that is disposed between the radiation-sensitive imageable layer and the cover sheet. Useful separation layer materials include but are not limited to, polyamides, poly(vinyl alcohols), copolymers of ethylene and vinyl acetate, amphoteric interpolymers, cellulosic polymers, poly(vinyl butyral), cyclic rubbers, and combinations thereof.

In most embodiments, the radiation-sensitive imageable layer comprises an elastomeric binder, at least one monomer, and an initiator that is sensitive to non-IR radiation. In most cases, the initiator will be sensitive to UV or visible radiation. Suitable initiator compositions include but are not limited to those described in U.S. Pat. No. 4,323,637 (Chen et al.), U.S. Pat. No. 4,427,749 (Gruetzmacher et al.), and U.S. Pat. No. 4,894,315 (Feinberg et al.) the disclosures of which are incorporated herein by reference.

The elastomeric binder can be one or more polymers or resins that can be soluble, swellable, or dispersible in aqueous, semi-aqueous, or organic solvent developers (described below) and include but are not limited to, polymers or resins that are soluble, swellable, or dispersible in organic solvents such as natural or synthetic polymers of conjugated diolefins, block copolymers, core-shell microgels, and blends of microgels and preformed macromolecular polymers. The elastomeric binder can comprise at least 65 weight % and up to and including 90 weight %, based on total dry layer weight. More details of such elastomeric binders are provided in [0190] of U.S. '182 (noted above) and references cited therein.

The radiation-sensitive imageable layer can also include one or more monomers that are compatible with the elastomeric binder to the extent that a clear, non-cloudy radiation-sensitive imageable is produced. Monomers for this purpose are well known the art and include ethylenically unsaturated polymerizable compounds having relatively low molecular weight (generally less than 30,000 Daltons). Examples of suitable monomers include but are not limited to, various mono- and polyacrylates, acrylate derivatives of isocyanates, esters, and epoxides. Specific monomers are described in [0191] of U.S. '182 (noted above) and in references cited therein. The typical amount of one or more monomers in the radiation-sensitive imageable layer is at least 5 weight % and up to and including 25 weight %, based on total dry layer weight.

The photoinitiator can be a single compound or combination of compounds that are sensitive to visible or UV radiation, or both, and that generates free radicals that initiate the polymerization of the monomer(s) without excessive termination and are generally present in an amount of from about 0.001 weight % and up to and including 10 weight % based on the total dry layer weight. Examples of suitable initiators include but are not limited to, substituted or unsubstituted polynuclear quinines and further details are provided in [0192] of U.S. '182 (noted above) and in references cited therein.

The radiation-sensitive imageable layer can include other addenda that provide various properties including but not limited to sensitizers, plasticizers, rheology modifiers, thermal polymerization inhibitors, tackifiers, colorants, antioxidants, antiozonants, and fillers, and in amounts that are known in the art.

The thickness of the radiation-sensitive imageable layer can vary depending upon the type of imaged relief-forming material desired. In some embodiments, a UV-sensitive imageable layer can be at least 500 μm and up to and including 6400 μm in average dry thickness. Average dry thickness can be determined similarly to that for the non-silver halide thermally sensitive imageable layer described above.

A spacer layer can be disposed on the radiation-sensitive imageable layer to that during curing of the radiation-sensitive imageable layer through the imaged mask material, the spacer layer is intermediate the imaged mask material. In most embodiments, the spacer layer is in direct contact with both the imaged mask material (first element) and the radiation-sensitive imageable layer of the relief-forming material (second element) so that the first and second elements are in intimate contact during photocuring. This contact is generally "continuous", meaning that there are little or no gaps between the first and second elements. The spacer layer can make removal of the imaged mask material easier, and either element in this assemblage can be peel from each other after curing of the radiation-sensitive imageable layer.

The spacer layer generally has an average dry thickness of at least 0.05 μm and up to and including 2 μm, or typically of at least 0.05 μm and up to and including 0.2 μm. The average dry thickness can be determined similarly to that for the non-silver halide thermally sensitive imageable layer described above.

The spacer layer can be composed of one or more polymers or resins including but not limited to, polyamides, poly(vinyl butyral), (meth)acrylamide polymers, nitrocellulose, polyacetals, polymers derived at least in part from any of methyl methacrylate, ethyl methacrylate, n-butyl methacrylate, and isobutyl methacrylate or a combination of two or more of these polymeric materials, which polymers can comprise at least 75 weight % and up to and including 100 weight % of the dry spacer layer weight. Various addenda can include if desired, including but not limited to surfactants, and plasticizers.

In one embodiment, the relief-forming material is a flexographic printing plate precursor that includes a suitable UV-curable composition in the radiation-sensitive imageable layer and when exposed through the imaged mask material and developed, provides a relief image in a flexographic printing plate. Such relief-forming materials generally include a suitable substrate, one or more UV-sensitive imageable layers comprising a photosensitive composition that includes a polymer or prepolymers, and photoinitiator. Examples of commercially available flexographic printing plate precursors include but are not limited to, FLEXCEL flexographic elements available from Eastman Kodak Company, CYREL® Flexographic plates available from DuPont (Wilmington, Del.), NYLOFLEX® FAR 284 plates available from BASF (Germany), FLEXILIGHT CBU plate available from Macdermid (Denver, Colo.), and ASAHI AFP XDI available from Asahi Kasei (Japan).

The relief-forming material can also be used to form a printed circuit board wherein a conducting layer (also known as a "printing circuit) is formed on a substrate in the pattern dictated by exposure through imaged mask material. Suitable precursors to printed circuit boards generally comprise a substrate, a metal layer, and a radiations-sensitive imageable layer. Suitable substrates include but are not limited to, polyimide films, glass-filled epoxy or phenol-formaldehyde or any other insulating materials known in the art. The metal layer covering the substrate is generally a conductive metal such as copper or an alloy or metals. The radiation-sensitive imageable layer can include an UV-curable resin, monomers, or oligomers, photoinitiators, and a polymeric binder. Further details of printed circuit boards are provided in [0196] to [0205] of U.S. '182 (noted above).

Forming Imaged Mask Materials

In the practice of this invention, an imaged mask material can be formed by producing exposed and non-exposed regions in the imageable material of this invention. The choice of imaging mechanism will determine the possible variations in forming the mask image, as described below.

Exposing the imageable material can be carried out in selected regions, otherwise known as "imagewise exposure". In some embodiments, imagewise exposure can be accomplished using thermal radiation from a thermal or infrared laser that is scanned or rasterized under computer control. Any of the known scanning devices can be used including flat-bed scanners, external drum scanners, and internal drum scanners. In these devices, the imageable material is secured to the drum or bed, and the laser beam is focused to a spot that can impinge on the imageable material. Two or more lasers can scan different regions of the imageable material simultaneously.

For example, the imageable material can be exposed to infrared radiation, for example, in the range of at least 700 and up to and including 1400 nm. Such imageable materials contain one or more infrared radiation absorbing compounds as described above to provide sensitivity to infrared radiation. In these embodiments, the imageable material can be suitably mounted to an infrared imager and exposed to the infrared radiation using an infrared laser such as a diode laser or Nd:YAG laser that can be scanned under computer control. Suitable infrared imagers include but are not limited to TRENDSETTER imagesetters and ThermoFlex Flexographic CTP imagers available from Eastman Kodak Company used for CTP lithographic plate applications and for imaging flexographic elements, DIMENSION imagesetters available from Presstek (Hudson, N.H.) useful for CTP lithographic plate applications, CYREL® Digital Imager (CDI SPARK) available from Esko-Graphics (Kennesaw, Ga.), and OMNISETTER imagers available from Misomex International (Hudson, N.H.) useful for imaging flexographic elements.

The step of forming a mask image can also include a step of removing either exposed or non-exposed regions of the non-silver halide thermally sensitive imageable layer. In some embodiments, the exposed regions are removed, leaving a mask image on the transparent carrier sheet (and barrier layer disposed thereon).

In other embodiments, a mask image is formed on the carrier sheet (and barrier layer disposed thereon) by producing exposed and non-exposed regions of the non-silver halide thermally sensitive imageable layer, and removing non-exposed regions of those layers.

In some embodiments, the mask image in the non-silver halide thermally sensitive layer can be cured by subjecting it to heat treatment, provided that the transfer property of the mask image is not adversely affected. Heat treatment can be done by a variety of means including but not limited to, storage in an oven, hot air treatment, or contact with a heated platen or passage through a heated roller device. Heat treatment is not necessary for curing to take place.

In still other embodiments, a mask image can be formed as noted above and the exposed regions are transferred to a receptor sheet. The receptor sheet it then removed from the imaged mask material before the mask image is transferred to a relief-forming material.

Where a separate receptor sheet is used during imaging of the imageable material, the imageable material and receptor sheet are assembled in close proximity prior to imaging, with the non-silver halide thermally sensitive imageable layer adjacent to the receptive sheet. The term "close proximity" in this context can mean that the non-silver halide thermally sensitive imageable layer and receptor sheet are brought into contact, or that they do not contact each other but are sufficiently close to allow transfer of non-silver halide thermally sensitive imageable layer upon exposure to thermal imaging radiation. Vacuum hold-down or a mechanical means can be used to secure the imageable material and receptor sheet in assembly.

Next, the assembly of the imageable material and receptor sheet can be imagewise exposed using imaging radiation to form a mask image, as described below. Imagewise exposure causes imagewise transfer of non-silver halide thermally sensitive imageable layer from the imageable material to the receptor sheet. After imaging, the imageable material can be removed from the receptor sheet to reveal the mask image on the receptor sheet.

Several mechanisms for thermal imaging the imageable material are mentioned briefly below and further details are provided by U.S. '182 (noted above) and references cited therein beginning with paragraphs [0142].

Ablation:

In this mechanism, the exposed regions of the non-silver halide thermally sensitive imageable layer are removed from the imaged mask material by the generation of a gas, leaving a mask image. Specific binders that decompose upon exposure to heat (such as IR laser irradiation) to rapidly generate a gas can be used. This action is to be distinguished from other mass transfer techniques in that a chemical rather than a physical change cases an almost complete transfer of the non-silver halide thermally sensitive imageable layer rather than a partial transfer.

Melt-Stick Technique:

The exposed areas of the imageable layer can be transferred in a molten or semi-molten state from the imaged film to a suitable receptor sheet upon exposure to radiation. The exposed areas are characterized by reduced viscosity that provides flowability to the non-silver halide thermally sensitive imageable layer that flows across to and adheres to the surface of the receptor sheet with greater strength than it adheres to the carrier sheet (and transparent layer disposed thereon). Following this physical transfer, the carrier sheet, along with the untransferred imageable layer, is separated from the receptor sheet.

In one embodiment, the mask image comprises the non-exposed regions remaining on the carrier sheet. In another embodiment, the mask image comprises the exposed regions of the non-silver halide thermally sensitive imageable layer that are transferred to the receptor sheet.

Laser-Induced Film Transfer:

With this imaging mechanism, the exposed regions of the non-silver halide thermally sensitive imageable layer are removed from the carrier sheet (and barrier layer disposed thereon) through laser-induced film transfer ("LIFT"). The barrier layer can contain a latent crosslinking agent that reacts with the barrier layer binder to form a high molecular weight network in the exposed regions to provide better control of melt flow phenomena, transfer of more cohesive material to the receptor sheet, and high quality edge sharpness of the resulting mask image.

In one embodiment, the non-silver halide thermally sensitive imageable layer includes a transferable colorant and an infrared radiation absorbing compound (such as an IR dye). In another embodiment, the non-silver halide thermally sensitive imageable layer includes a transferable colorant, a polymeric binder as described above, a fluorocarbon additive, a cationic IR dye, and latent crosslinking agent as described above.

The mask image can comprise the non-exposed regions of the non-silver halide thermally sensitive imageable layer remaining in the imaged mask material, but in other embodiments, the mask image comprises the exposed regions that are transferred to a receptor sheet.

Peel-Apart:

In this imaging mechanism, the exposed regions of the non-thermally sensitive thermally sensitive imageable layer are removed from the carrier sheet (and barrier layer disposed thereon) using a suitable receptor sheet based differential adhesion properties in the non-silver halide thermally sensitive imageable layer. After imagewise exposure of the imageable material, the receptor sheet is separated from the carrier sheet and either exposed or non-exposed regions remain in the imaged mask material.

Dye Sublimation or Diffusion:

In yet another imaging technique, colorant from exposed regions of the non-silver halide thermally sensitive imageable layer is removed through sublimation wherein the colorant is diffused or sublimed without simultaneous transfer of the layer binder. A mask image can be generated in the imageable material without the need for a receptor sheet. In other embodiments, a receptor sheet is used to capture the sublimed colorant. The mask image then comprises the non-silver halide thermally sensitive imageable layer remaining in the imaged mask material. In still other embodiments, the mask image comprises the colorant that is transferred to a receptor sheet.

Forming Relief Images

After the imaged mask material is formed as described above, it is brought into complete optical contact with a suitable relief-forming material (described above) that is sensitive to curing radiation (usually UV radiation). This can be accomplished by placing the imaged mask material onto the relief-forming material or vice versa.

In general, the imaged mask material and relief-forming material are placed in such optical contact as to provide an air-free interface. Generally, this is achieved by laminating the imaged mask material to the radiation-sensitive element by applying pressure or heat, or both pressure and heat to form an air-free or gap-free interface. However, if the relief-forming material includes a spacer layer (as described above), the laminating procedure may be avoided.

Commercially available laminators that provide both heat and pressure can be used including but not limited to, KODAK model 800XL APPROVAL LAMINATOR available from Eastman Kodak Company (Rochester, N.Y.), CODOR LPP650 LAMINATOR available from CODOR (Amsterdam, Holland), and LEDCO HD laminators available from Filmsource (Casselbury, Fla.). Is a transparent polymeric overcoat layer is attached directly to the non-silver halide thermally sensitive imageable layer of the imageable material, it can be before lamination or other means of forming optical contact with the relief-forming material. The assemblage of the imageable material and the relief-forming material can be fed into the laminator at a desired speed, temperature, and pressure.

In one embodiment, the relief-forming material does not have a spacer layer and pressure alone can be sufficient to achieve an air-free interface, as the relief-forming layer in the relief-forming material can be tacky, or act as a pressure sensitive adhesive, due to the presence of monomers.

In still another embodiment, transfer of the imaged mask material can be achieved by using pressure-sensitive adhesion when it is pressed into contact with the relief-forming material to form an air-free interface. A pressure-sensitive adhesive can be incorporated into the outermost layer of the relief-forming material, or it can be placed in the separate spacer layer (described above). Suitable pressure-sensitive adhesives are known in the art.

In still another embodiment, the imaged mask material can be transferred using what is known as a "liquid photopolymer process" in which a radiation-sensitive or photopolymer composition is uniformly applied, in liquid or paste form, to the imaged mask material containing the mask image, for example, by placing the radiation-sensitive composition between the imaged mask material and a transparent support material that then becomes the "support" or substrate for the relief-forming material. For example, the transparent support material can be a polymeric film as described above.

In some embodiments, the method further comprises laminating the relief-forming material and imaged mask material prior to imaging the relief-forming material.

After an air-free contact is made between the imaged mask material and the relief-forming material as described above, the relief-forming material is exposed to curing radiation (see below) through the imaged mask material to form an imaged relief-forming material with exposed regions and non-exposed regions. Thus, the curing radiation is projected onto the relief-forming material through the mask image that preferentially blocks some of the radiation. In unmasked (exposed) regions, curing radiation will cause hardening or curing of the radiation-sensitive composition(s) in the non-silver halide thermally sensitive imageable layer. The mask image should therefore be substantially opaque to the exposing or curing radiation, meaning that the mask image should have a transmission optical density of 2 or more and typically 3 or more. The unmasked (exposed) regions of the imaged mask material should be substantially transparent meaning that it should have a transmission optical density of 0.5 or less, or even 0.1 or less, and more typically at least 0.5 and up to and including 0.1 or at least 0.1 and up to and including 0.3. Transmission optical density can be measured using a suitable filter on a densitometer, for example, a MACBETH TR 927 densitometer.

Generally, exposure of the relief-forming material through the imaged mask material containing the mask image is accomplished by floodwise exposure from suitable irradiation sources (for example, visible radiation or UV radiation). Exposure can be carried out in the presence of atmospheric oxygen. Exposure under vacuum is not necessary as air-free contact (or optical contact) has already been made.

In the manufacture of a relief printing plate, such as a flexographic printing plate, one side of the relief-forming material is generally first exposed to curing radiation through its transparent support (known as "back exposure") to prepare a thin, uniform cured layer on the support side of the material. The relief-forming material is then exposed to curing radiation through the imaged mask material containing the mask image, thereby causing the non-silver halide thermally sensitive composition to harden or cure in the unmasked areas. Unexposed and uncured regions of the radiation-sensitive element are then removed by a developing process (described below), leaving the cured regions that define the relief printing surface. The back exposure can be performed either before or after the air-free contact is made between the imaged mask material and the relief-forming material.

The wavelength or range of wavelengths suitable as the curing radiation will be dictated by the nature of the relief-forming material. In some embodiments, the curing radiation is ultraviolet radiation at a wavelength of at least 150 and up to and including 450 nm. Sources of UV radiation for floodwise or overall exposure include but are not limited to, carbon arcs, mercury-vapor arcs, fluorescent lamps, electron flash units, and photographic flood lamps. UV radiation is particularly useful from mercury-vapor lamps and more particularly sun lamps. Representative UV radiation sources include SYLVANIA 350 BLACKLIGHT fluorescent lamp (FR 48T12/350 VL/VHO/180, 115 watts) that has a central emission wavelength of about 354 nm that is available from Topbulb (East Chicago, Ind.), and BURGESS EXPOSURE FRAME, Model 5K-3343VSII with ADDALUX 754-18017 lamp available from Burgess Industries, Inc. (Plymouth, Mass.).

Other suitable sources of UV radiation include platemakers that are able to both expose the relief-forming material to radiation and to develop the imaged relief-forming material after radiation exposure. Examples of suitable platemakers include but are not limited to, KELLEIGH MODEL 310 PLATEMAKER available from Kelleigh Corporation (Trenton, N.J.) and the GPP500F PLATE PROCESSOR available from Global Asia Ltd. (Hong Kong).

The time for exposure through the imaged mask material will depend upon the nature and thickness of the relief-forming material and the source of the radiation. For example, in one of embodiment, a FLEXCEL-SRH plate precursor available from Eastman Kodak Company can be mounted on a KELLEIGH MODEL 310 PLATEMAKER and back exposed to UV-A radiation through the transparent support for about 20 seconds to prepare a thin, uniform cured layer on the support side of the relief-forming material. The assemblage can then be exposed to a UV radiation through the imaged mask material for about 14 minutes. The mask image information is thus transferred to the relief-forming material (such as a flexographic plate precursor).

In general, the method can also comprise removing the imaged mask material from complete optical contact with the imaged relief-forming material after exposing and before developing. This can be done using any suitable manner, such as peeling. For example, this can be accomplished by removing the imaged mask material from complete optical contact with the imaged relief-forming material after exposing and before developing, by pulling the imaged mask material from the imaged relief-forming material.

The imaged relief-forming material is then generally developed with a suitable developer to form a relief image. Development serves to remove the non-exposed (uncured) regions of the imaged relief-forming, radiation-sensitive layer, leaving the exposed (cured) regions that define the relief image.

Any known developer can be used in this processing step including those containing chlorinated organic solvents. However, some useful developers are predominantly non-chlorinated organic solvents. By "predominantly", it is meant that more than 50% (by volume) of the developer comprises one or more non-chlorinated organic solvents such as aliphatic hydrocarbons and long chain alcohols (that is alcohols with at least 7 carbon atoms). The remainder of the developers can be chlorinated organic solvents that are known in the art for this purpose.

Certain useful developers are predominantly what are known as "perchloroethylene alternative solvents" (PAS). These PAS are generally volatile organic compounds typically comprised of mixtures of aliphatic hydrocarbons and long-chain alcohols. They are generally stable under normal room temperature and storage conditions. Examples of such commercially available solvents include but are not limited to, PLATESOLV available from Hydrite Chemical Co. (Brookfield, Wis.), NYLOSOLV® available from BASF (Germany), FLEXOSOL® available from DuPont (Wilmington, Del.), OptiSol® available from DuPont (Wilmington, Del.), and SOLVIT® QD available from MacDermid (Denver, Colo.).

Other useful developers are described in U.S. Pat. No. 5,354,645 (Schober et al.), the disclosure of which is incorporate herein by reference, and include one or more of diethylene glycol dialkyl ethers, acetic acid esters or alcohols, carboxylic acid esters, and esters of alkoxy substituted carboxylic acids. Other useful developers are described in U.S. Pat. No. 6,162,593 (Wyatt et al) described developers comprising diisopropylbenzene (DIPB), U.S. Pat. No. 5,248,502 (Eklund), U.S. Pat. No. 6,248,502 (Eklund), the disclosures of which are incorporated herein by reference.

Additional useful developers are described in U.S. Pat. No. 6,582,886 (Hendrickson et al.), the disclosure of which is incorporated herein by reference, and contain methyl esters alone or mixtures of methyl esters and co-solvents such as various alcohols that are soluble in the methyl ester(s). These developers can also include various non-solvents such as petroleum distillates naphthas, paraffinic solvents, and mineral oils.

Still other useful developers include chlorohydrocarbons, saturated cyclic or acyclic hydrocarbons, aromatic hydrocarbons, lower aliphatic ketones, or terpene hydrocarbons, but these are not the best as some have hazardous air pollutants (HAPS) and are subject to stringent governmental reporting requirements.

U.S. Patent Application Publication 2010/0068651 (Bradford) describes useful developers containing dipropylene glycol dimethyl ether (DME) alone or in combination with various co-solvents such as alcohols and aliphatic dibasic acid ethers. The disclosure of this publication is incorporated herein by reference.

Still other useful developers are described in U.S Patent Application Publication 2011/0183260 (Fohrenkamm et al.), the disclosure of which is incorporated herein by reference. Such developers can comprise:

a. one or more esters of monobasic carboxylic acids represented by one or both of the following Structures (I) and (II):

wherein $R_1$ is an alkyl group having 1 to 5 carbon atoms, $Ar_1$ is a substituted or unsubstituted phenyl or naphthyl group, and n is 1 to 3, and

wherein R is a hydrocarbon having 6 to 15 carbon atoms, and b. one or more aliphatic alcohols, or a combination of one or more aliphatic alcohols and one or more aromatic alcohols.

Some embodiments of such developers comprise:

a. one or more esters of monobasic carboxylic acids represented by the following Structure (I):

wherein $R_1$ is an alkyl group having 1 to 5 carbon atoms, $Ar_1$ is a substituted or unsubstituted phenyl or naphthyl group, and n is 1 to 3, and b. one or more aliphatic alcohols, or a combination of one or more aliphatic alcohols and one or more aromatic alcohols.

More specific developers consist essentially of:

a. from about 5 to about 70 weight % of benzyl acetate or propionate, b. from about 5 to about 40 weight % of 2-ethylhexyl alcohol, octyl alcohol, or benzyl alcohol, and c. from about 5 to about 50 weight % of a petroleum distillate.

Development is usually carried out under known conditions such as for at least 1 minute and up to and including 20 minutes and at a temperature of at least 20° C. and up to and including 32° C. The type of developing apparatus and specific developer that are used will dictate the specific development conditions and can be adapted by a skilled worker in the art.

Post-development processing of the relief image in the imaged relief-forming material can be suitable under some circumstances. Typical post-development processing includes drying the relief image to remove any excess solvent and post-curing by exposing the relief image to curing radiation to cause further hardening or crosslinking. The conditions for these processes are well known to those skilled in the art. For example, the relief image can be blotted or wiped dry, or dried in a forced air or infrared oven. Drying times and temperatures would be apparent to a skilled artisan. Post-curing can be carried out using the same type of radiation previously used to expose the relief-forming material through the imaged mask material.

Detackification (or "light finishing") can be used if the relief image surface is still tacky. Such treatments, for example, by treatment with bromide or chlorine solutions or exposure to UV or visible radiation, are well known to a skilled artisan.

The resulting relief image can have a depth of at least 2% and up to and including 100% of the original thickness of the radiation-sensitive layer (for example, if this layer is disposed on a support). For a flexographic printing plate, the maximum dry depth of the relief image can be from at least 150 µm and up to and including 1000 µm, or typically at least 200 µm and up to and including 500 µm. For a printed circuit board, the radiation-sensitive imageable layer is completely removed in either the exposed or non-exposed regions, to reveal the metal layer underneath. In such elements, the maximum depth of the relief image depends upon the dry thickness of the radiation-sensitive imageable layer. Advantageously, in any embodiments, the relief image can have shoulder angles of greater than 50°.

Thus, in some embodiments, the method is carried out wherein the relief-forming material is a UV-sensitive flexographic printing plate precursor and imaging and developing the UV-sensitive flexographic printing plate precursor provides a flexographic printing plate.

The present invention provides at least the following embodiments and combinations thereof, but other combinations of features are considered to be within the present invention as a skilled artisan would appreciate from the teaching of this disclosure:

1. An imageable material consisting essentially of, in order:
   (a) a transparent polymeric carrier sheet,
   (b) a barrier layer disposed directly on the transparent polymeric carrier sheet, the barrier layer comprising a first infrared radiation absorbing compound,
   wherein either or both of the transparent polymeric carrier sheet and barrier layer further comprise a first ultraviolet radiation absorbing compound, and
   (c) a non-silver halide thermally sensitive imageable layer disposed directly on the barrier layer, the non-silver halide thermally sensitive imageable layer comprising a second infrared radiation absorbing compound and a second ultraviolet radiation absorbing compound, both dispersed within a polymeric binder.

2. The imageable material of embodiment 1, further containing a transparent polymeric overcoat layer attached directly to the non-silver halide thermally sensitive imageable layer.

3. The imageable material of embodiment 1 or 2, wherein the first ultraviolet radiation absorbing compound is present only in the barrier layer.

4. The imageable material of any of embodiments 1 to 3, wherein the first and second ultraviolet radiation absorbing compounds are the same or different UV-absorbing dyes, and the amount of the first ultraviolet radiation absorbing compound is less than the amount of the second ultraviolet radiation absorbing compound.

5. The imageable material of any of embodiments 1 to 4, wherein the barrier layer comprises a heat-combustible polymer binder that is nitrocellulose, a poly(cyanoacrylate), or a combination thereof, and optionally metal oxide particles or crosslinking agents, or
   the barrier layer is a metal or metalized layer.

6. The imageable material of any of embodiments 1 to 5, wherein the non-silver halide thermally sensitive imageable layer comprises a polymer or resin binder that is a polyurethane, poly(vinyl butyral), (meth)acrylamide polymer, nitrocellulose, polyacetal, polymer derived at least in part from any of methyl methacrylate, ethyl methacrylate, n-butyl methacrylate, and isobutyl methacrylate, or a combination of two or more of these materials, or
   the transparent polymeric carrier sheet comprises a polyester, polyethylene-polypropylene copolymer, polybutadiene, polycarbonate, polyacrylate, vinyl chloride polymer, hydrolyzed or non-hydrolyzed cellulose acetate, or a combination of two or more of these materials, and optionally comprising an adhesion promoter.

7. The imageable material of any of embodiments 1 to 6, comprising one or more of the following conditions:
   (i) the transparent polymeric carrier sheet has an average dry thickness of at least 25 µm and up to and including 250 µm,
   (ii) the barrier layer has an average dry thickness of at least 0.25 µm and up to and including 2.5 µm, and
   (iii) the non-silver halide thermally sensitive imageable layer has an average dry thickness of at least 0.5 µm and up to and including 5 µm, and
   when the imageable material further comprises a transparent polymeric overcoat layer attached directly to the non-silver halide thermally sensitive imageable layer, and the transparent polymeric overcoat layer has an average dry thickness of at least 0.05 µm and up to and including 1 µm.

8. The imageable material of any of embodiments 1 to 7, wherein the non-silver halide thermally sensitive imageable layer comprises the polymer or resin binder in an amount of at least 25 weight % and up to and including 75 weight %.

9. The imageable material of any of embodiments 1 to 8, wherein the first and second infrared radiation absorbing compound are the same material.

10. A method of making a relief image, the method comprising:
    imaging the imageable material of any of embodiments 1 to 9 to form an imaged mask material,
    exposing a relief-forming material with curing radiation through the imaged mask material while they are in complete optical contact, to form an imaged relief-forming material with exposed regions and non-exposed regions, and
    developing the imaged relief-forming material to form a relief image by removing its non-exposed regions.

11. The method of embodiment 10, further comprising: removing the imaged mask material from complete optical contact with the imaged relief-forming material after exposing and before developing.

12. The method of embodiment 10 or 11, further comprising:
    removing the imaged mask material from complete optical contact with the imaged relief-forming material after exposing and before developing, by pulling the imaged mask material from the imaged relief-forming material.

13. The method of any of embodiments 10 to 12, comprising:
    exposing the relief-forming material to UV radiation through the imaged mask material.

14. The method of any of embodiments 10 to 13, wherein the relief-forming material is a UV-sensitive flexographic printing plate precursor, and imaging and developing the UV-sensitive flexographic printing plate precursor provides a flexographic printing plate.

15. The method of any of embodiments 10 to 14, further comprising:
    laminating the relief-forming material and imaged mask material prior to imaging the relief-forming material.

16. The method of any of embodiments 10 to 15, comprising:

developing the imaged relief-forming material using a developer comprising an ester of a monobasic carboxylic acid, an aliphatic hydrocarbon, long-chain alcohol, terpene, or a combination of two or more of these materials.

17. The method of any of embodiments 10 to 16, wherein the relief-forming material further comprises a spacer layer intermediate the imaged mask material.

18. The method of embodiment 17, wherein the spacer layer has an average dry thickness of at least 0.05 µm and up to and including 2 µm.

19. The method of embodiment 17 or 18, wherein the spacer layer has an average dry thickness of at least 0.05 µm and up to and including 0.2 µm.

20. The method of any of embodiments 10 to 19, wherein:

(a) the first ultraviolet radiation absorbing compound is present only in the barrier layer, the first and second ultraviolet radiation absorbing compounds in the imageable material are the same or different UV-absorbing dyes, and the amount of the first ultraviolet radiation absorbing compound is less than the amount of the second ultraviolet radiation absorbing compound, (b) the barrier layer in the imageable material comprises a heat-combustible polymer binder that is nitrocellulose, a poly (cyanoacrylate), or a combination thereof, and optionally metal oxide particles or crosslinking agents, or the barrier layer is a metal or metalized layer, (c) the non-silver halide thermally sensitive imageable layer in the imageable material comprises a polymer or resin binder that is a polyurethane, poly(vinyl butyral), (meth)acrylamide polymer, nitrocellulose, polyacetal, polymer derived at least in part from any of methyl methacrylate, ethyl methacrylate, n-butyl methacrylate, and isobutyl methacrylate, or a combination of two or more of these materials, (d) the transparent polymeric carrier sheet comprises a polyester, polyethylene-polypropylene copolymer, polybutadiene, polycarbonate, polyacrylate, vinyl chloride polymer, hydrolyzed or non-hydrolyzed cellulose acetate, or a combination of two or more of these materials, and optionally comprising an adhesion promoter, (e) the imageable material comprising one or more of the following conditions:

(i) the transparent polymeric carrier sheet has an average dry thickness of at least 25 µm and up to and including 250 µm, (ii) the bather layer has an average dry thickness of at least 0.25 µm and up to and including 2.5 µm, and (iii) the non-silver halide thermally sensitive imageable layer has an average dry thickness of at least 0.5 µm and up to and including 5 µm, and when the imageable material further comprises a transparent polymeric overcoat layer attached directly to the non-silver halide thermally sensitive imageable layer, and the transparent polymeric overcoat layer has an average dry thickness of at least 0.05 µm and up to and including 1 µm, and (f) the non-silver halide thermally sensitive imageable layer of the imageable material comprises the polymer or resin binder in an amount of at least 25 weight % and up to and including 75 weight %.

The following Examples are provided to illustrate the practice of this invention and are not meant to be limiting in any manner.

The following materials and methods were used in the examples:

AIRVOL® 205 premix solution is a 10% solids aqueous solution of a poly(vinyl alcohol) that can be obtained from Air Products (Allentown, Pa.).

BUTVAR® B-76 is a poly(vinyl butyral) resin that can be obtained from Solutia, Inc. (St. Louis, Mo.).

Byk® 333 is a polyether modified polydimethylsiloxane that can be obtained from Byk Chemie (Wallingford, Conn.).

Curcumin is a yellow dye that can be obtained from Cayman Chemicals (Ann Arbor, Mich.).

Dyneon™ FC 2211 and 2178 are fluoroelastomers that can be obtained from 3M Company (St. Paul, Minn.).

EMAX is a 60:40 copolymer derived from ethyl methacrylate and methacrylic acid, which copolymer can be obtained from Eastman Kodak Company (Rochester, N.Y.).

Fluon® AD1 is a PTFE dispersion that can be obtained from Asahi Glass Fluoropolymers USA.

IR Dye A is an IR absorbing dye having the following structure and was obtained from Eastman Kodak Company (Rochester, N.Y.).

MEK represents methyl ethyl ketone.

MIBK represents methyl iso-butyl ketone.

NeoRez 322 polyurethane resin that can be obtained from DSM NeoResins (Wilmington, Mass.).

NeoRez U395 is a polyurethane resin that can be obtained from DSM NeoResins (Wilmington, Mass.).

PCA represents a mixture of 70% (weight) poly(methyl cyanoacrylate) and 30% (weight) poly(ethyl cyanoacrylate) as a 10% total solids solution in 50/50 cyclopentanone/acetone, obtained from Eastman Kodak Company (Rochester, N.Y.).

Sudan Black is a black dye that can be obtained from Aldrich Chemicals Co. (Milwaukee, Wis.).

Surfynol® FS-80 is a wetting agent that can be obtained from Air Products & Chemicals, Inc. (Allentown, Pa.).

Uvinul® 3050 is an ultraviolet radiation absorbing dye that can be obtained from BASF (Germany).

Comparative Example 1

An imageable material outside of the present invention was prepared in the following manner.

A transparent polymeric carrier sheet, formed of a 0.01 cm thick poly(ethylene terephthalate), was coated with the transparent layer formulation comprising Dyneon™ FC 2211 out of MEK using a #12 wire rod to provide a transparent layer having a dry coverage of 562 mg/m² when dried for 2 minutes at 93° C.

Onto this transparent layer was coated a intermediate layer formulation containing Airvol® 205 poly(vinyl alcohol) out of an 80:20 water:n-propanol mixture using a #10 wound-wire coating rod. The resulting coating was dried at 2 minutes at 93° C. to provide a dry coating coverage of about 648 mg/m².

A barrier layer formulation was formed with the components and coating solvents listed in the following TABLE I and applied to the dried intermediate layer using a #10 wound-wire coating rod. The resulting coating was dried at about 93° C. for 2 minutes to form a barrier layer to provide a coating coverage of about 378 mg/m².

TABLE I

| Barrier Layer Formulation Component | Component Amount (% solids) |
|---|---|
| PCA | 84 |
| NeoRez U395 | 5 |
| IR Dye A | 11 |
| Acetone | 40 parts |
| Cyclopentanone | 60 parts |

On the dried barrier layer, a non-silver halide thermally sensitive imageable layer was formed using the components and coating solvents shown in the following TABLE II using a #20 wound-wire coating rod. The resulting coating was dried at about 93° C. for 2 minutes to provide a dry coverage of about 1.51 g/m².

TABLE II

| Non-Silver Halide Thermally Sensitive Imageable Layer Formulation Components | Component Amount (% solids) |
|---|---|
| Sudan Black | 10 |
| Uvinul ® 3050 | 14.3 |
| Curcumin | 28.7 |
| Nitrocellulose | 16 |
| NeoRez U395 | 8.8 |
| NeoRez U322 | 8.8 |
| IR Dye A | 13.5 |
| MEK | 5 parts |
| Cyclohexanone | 5 parts |
| MIBK | 80 parts |
| Ethanol | 10 parts |

A transparent polymeric overcoat layer was formed using the components and coating solvents shown in the following TABLE III as applied over the dried non-silver halide thermally sensitive imageable layer using a #20 wound-wire coating rod. The resulting coating was dried at about 93° C. for 2 minutes to a dry transparent polymeric overcoat layer at a coating coverage of about 120 mg/m².

TABLE III

| Transparent Polymeric Overcoat Layer Formulation Components | Component Amount (% solids) |
|---|---|
| EMAX | 61.5 |
| Fluon ® AD1 | 10.5 |
| Byk ® 333 | 30 |
| Surfynol ® FS-80 | 10 |
| Airvol ® 205 | 15 |
| NeoRez U322 | 8.8 |
| Water | 80 parts |
| Ethanol | 20 parts |

The resulting Comparative 1 imageable material was used to prepare a flexographic printing plate as described below.

Comparative Example 2

For Comparative Example 2, an imageable material was prepared as described in Comparative Example 1, except that the transparent layer was omitted.

Invention Example 1

An imageable material of the present invention was prepared like that described for Comparative Example 1, except that the transparent layer was omitted, and the barrier layer was prepared using the components and coating solvents shown below in TABLE IV and coated using a #12 wire-wound coating rod to provide a barrier layer coating at a dry coverage of 1.41 g/m².

TABLE IV

| Barrier Layer Formulation Component | Component Amount (grams) |
|---|---|
| PCA | 7.792 |
| Uvinol ® 3050 | 0.109 |
| IRT IR Dye* | 0.043 |
| Curcumin | 0.090 |
| Acetone | 50.0 |
| Cyclopentanone | 41.966 |

*IRT IR dye is an infrared radiation absorbing dye available from Showa Denko (Japan).

Forming Flexographic Printing Plates and Evaluations:

Each of the imageable materials of Comparative Examples 1 and 2 and Invention Example 1 was imaged on a Kodak Trendsetter® 800 Imager (Kodak SQUARESPOT head, 830 nm exposure wavelength) to form an imaged mask material containing a mask image. This mask image was then transferred from the imaged mask material by laminating it by applying pressure (without heat) to a FLEXEL MXH flexographic printing plate precursor that is available from Eastman Kodak Company (Rochester, N.Y.), so that the interface between the imaged mask material and precursor was air-free.

The resulting assembly of imaged mask material and flexographic printing plate precursor were exposed through the mask image using a Mekrom 302 Exposure frame and developing in a Mekrom 301 processor for time shown in TABLE V below using Flexcel LO-NX developer (available from Eastman Kodak Company), followed by normal drying and post curing to provide imaged flexographic printing plates. Before this primary exposure, each of the precursors was exposed through the back side for 15 seconds.

Each of the resulting flexographic printing plates (Flexcel NXH 0.045, Eastman Kodak Company) was evaluated for Relief (target of about 0.024 inch, 0.064 cm), Hilite spacing (target greater than 15), and RLD (target >140 μm).

TABLE V

| Example | Exposure Time (min) | Relief (inch; cm) | Hilite Spacing | RLD (μm) |
|---|---|---|---|---|
| Comparative 1 | 10 | 0.024; 0.061 | 14 | 171 |
| Comparative 1 | 12 | 0.023; 0.058 | 18 | 169 |
| Comparative 1 | 14 | 0.025; 0.064 | 18 | 159 |
| Comparative 2 | 5 | 0.025; 0.064 | 12 | 94 |
| Comparative 2 | 9 | 0.025; 0.064 | 18 | 64 |
| Comparative 2 | 11 | 0.025; 0.064 | 18 | 64 |
| Invention 1 | 10 | 0.024; 0.061 | 13 | 162 |
| Invention 1 | 13 | 0.024; 0.061 | 15 | 156 |
| Invention 1 | 16 | 0.024; 0.061 | 19 | 143 |

The data provided in TABLE V show that use of both the Comparative Example 1 and Invention Example 1 imageable materials provided good exposure latitude so that desirable Hilite Spacing and RLD values were obtained. However, the Comparative Example 2 imageable material exhibited poor exposure latitude as evidenced by poor RLD values and poor Hilite Spacing at the lowest exposure time. Thus, the Invention Example 1 imageable film demonstrated significant advantage over Comparative Example 2.

Invention Example 1 has several advantages over the imageable film of Comparative Example 1 because the invention imageable film is a simpler construction and thus less costly to manufacture and use. In addition, the Comparative Example 1 imageable film can sometimes exhibit internal adhesion failure when it is subjected to multiple flexing and bending operations. The Invention Example 1 does not exhibit this problem.

Invention Example 2

Certain lower durometer (softer) flexographic printing plate precursors used for printing corrugated (cardboard) surfaces have a high adhesive nature. The use of these precursors can require a high peel force to separate an imaged mask material from the precursor after precursor exposure when using a corrugated flexographic printing plate without an anti-tack layer.

In this Example, a flexographic printing plate precursor was prepared with a thin spacer layer disposed on the relief-forming material (layer) that was used to reduce the peel force into a more practical range. The thin spacer layer had a dry thickness of about 0.15 μm. The spacer layer formulation contained the components described in TABLE VI below.

TABLE VI

| Component | WEIGHT (g) |
| --- | --- |
| Macromelt ® 6900 | 0.897 |
| Byk ® 333 | 0.0029 |
| n-Propanol | 69.250 |
| Toluene | 29.700 |

Macromelt® 6900 is a polyamide material available from Henkel. Byk® 333 is a surfactant available from Byk-Chemie. The spacer layer formulation was coated to provide a dry coating weight of 0.16 g/m² using a #14 Meyer bar onto an untreated 4 mil (0.01 cm) poly(ethylene terephthalate) film (Dupont 400AP type).

The coated film was hand-laminated onto a 2.84 mm SRC flexographic printing plate precursor (Eastman Kodak Company) from which the anti-tack layer had been removed, without added heat. The poly(ethylene terephthalate) film was then removed and the thin spacer layer was transferred to the imageable side of the SRC precursor surface.

An imaged mask material (like that described in Invention Example 1) was laminated to two 2.84 mm SRC precursors, one with the thin spacer layer and one without a spacer layer. The resulting assemblies were then UV exposed through the mask image and the peel force was measured for removing the imaged mask material from the imaged precursor. The peel force results were found to be as follows:

| | |
| --- | --- |
| No spacer layer | 350-700 g/inch (138-276 g/cm) |
| With spacer layer | 30-150 g/inch (11.8-59 g/cm) |

Peel force was measured using a SP-2100 Peel force tester (Imass, Inc.). The high peel force measured without a spacer layer can result in kinks in the imaged precursor during delamination. No significant differences in image quality relating to dot retention or RLD (reverse line depth) of the resulting flexographic printing plates were found.

The invention has been described in detail with particular reference to certain preferred embodiments thereof, but it will be understood that variations and modifications can be effected within the spirit and scope of the invention.

The invention claimed is:

1. An imageable material consisting essentially of, in order:
   (a) a transparent polymeric carrier sheet,
   (b) a barrier layer disposed directly on the transparent polymeric carrier sheet, the barrier layer comprising a first infrared radiation absorbing compound,
   wherein either or both of the transparent polymeric carrier sheet and barrier layer further comprise a first ultraviolet radiation absorbing compound, and
   (c) a non-silver halide thermally sensitive imageable layer disposed directly on the barrier layer, the non-silver halide thermally sensitive imageable layer comprising a second infrared radiation absorbing compound and a second ultraviolet radiation absorbing compound, both dispersed within a polymeric binder wherein the first ultraviolet radiation absorbing compound and the second ultraviolet absorbing compound are same or different UV-absorbing dyes, and the total amount of the first ultraviolet radiation absorbing compound in either or both of the transparent polymeric carrier sheet and the barrier layer, is less than the amount of the second ultraviolet radiation absorbing compound.

2. The imageable material of claim 1, further containing a transparent polymeric overcoat layer disposed directly to the non-silver halide thermally sensitive imageable layer.

3. The imageable material of claim 1, wherein the first ultraviolet radiation absorbing compound is present only in the barrier layer.

4. The imageable material of claim 1, wherein the barrier layer comprises a heat-combustible polymer binder that is nitrocellulose, a poly(cyanoacrylate), or a combination thereof, and optionally metal oxide particles or crosslinking agents, or
   the barrier layer is a metal or metalized layer.

5. The imageable material of claim 1, wherein the non-silver halide thermally sensitive imageable layer comprises a polymer or resin binder that is a polyurethane, poly(vinyl butyral), (meth)acrylamide polymer, nitrocellulose, polyacetal, polymer derived at least in part from any of methyl methacrylate, ethyl methacrylate, n-butyl methacrylate, and isobutyl methacrylate, or a combination of two or more of these materials, or
   the transparent polymeric carrier sheet comprises a polyester, polyethylene-polypropylene copolymer, polybutadiene, polycarbonate, polyacrylate, vinyl chloride polymer, hydrolyzed or non-hydrolyzed cellulose acetate, or a combination of two or more of these materials, and optionally comprising an adhesion promoter.

6. The imageable material of claim 1, comprising one or more of the following conditions:
   (i) the transparent polymeric carrier sheet has an average dry thickness of at least 25 μm and up to and including 250 μm,
   (ii) the barrier layer has an average dry thickness of at least 0.25 μm and up to and including 2.5 μm, (iii) the non-silver halide thermally sensitive imageable layer has an average dry thickness of at least 0.5 μm and up to and including 5 μm, (iv) the first ultraviolet absorbing compound is present only in the barrier layer, and when the imageable material further comprises a transparent polymeric overcoat layer attached directly to the non-silver halide thermally sensitive imageable layer, and the transparent polymeric overcoat layer has an average dry thickness of at least 0.05 μm and up to and including 1 μm.

7. The imageable material of claim 1, wherein the non-silver halide thermally sensitive imageable layer comprises the polymeric binder in an amount of at least 25 weight % and up to and including 75 weight %.

8. The imageable material of claim 1, wherein the first and second infrared radiation absorbing compound are the same material.

* * * * *